(12) United States Patent
Haishi et al.

(10) Patent No.: US 8,580,088 B2
(45) Date of Patent: Nov. 12, 2013

(54) METHOD FOR PRODUCING TRANSPARENT CONDUCTIVE FILM

(75) Inventors: Motoki Haishi, Ibaraki (JP); Tomotake Nashiki, Ibaraki (JP); Tomonori Noguchi, Ibaraki (JP); Yoshifumi Asahara, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 0 days.

(21) Appl. No.: 13/280,758

(22) Filed: Oct. 25, 2011

(65) Prior Publication Data

US 2012/0111718 A1    May 10, 2012

(30) Foreign Application Priority Data

Nov. 5, 2010 (JP) .................. 2010-248842
Jun. 21, 2011 (JP) .................. 2011-137002

(51) Int. Cl.
*C23C 14/34* (2006.01)

(52) U.S. Cl.
USPC ............. 204/192.29; 204/192.15; 204/192.26

(58) Field of Classification Search
USPC .......................... 204/192.15, 192.26, 192.29
See application file for complete search history.

(56) References Cited

U.S. PATENT DOCUMENTS

| | | | |
|---|---|---|---|
| 4,835,061 A | | 5/1989 | Ohta et al. |
| 5,011,585 A | * | 4/1991 | Brochot et al. .......... 204/192.13 |
| 6,534,183 B1 | | 3/2003 | Inoue |
| 6,689,477 B2 | | 2/2004 | Inoue |
| 6,743,488 B2 | | 6/2004 | Memarian et al. |
| 2003/0035906 A1 | | 2/2003 | Memarian et al. |
| 2003/0148871 A1 | | 8/2003 | Inoue |
| 2008/0261030 A1 | | 10/2008 | Nashiki et al. |
| 2012/0012370 A1 | | 1/2012 | Nashiki et al. |

FOREIGN PATENT DOCUMENTS

| | | |
|---|---|---|
| CN | 1287545 A | 3/2001 |
| CN | 1525912 A | 9/2004 |
| CN | 101124348 A | 2/2008 |
| JP | 61-114843 A | 6/1986 |
| JP | 08-043841 A | 2/1996 |
| JP | 08-174747 A | 7/1996 |
| JP | 09-031630 A | 2/1997 |
| JP | 10-049306 A | 2/1998 |
| JP | 2005-307269 A | 11/2005 |
| JP | 2006-244771 A | 9/2006 |

(Continued)

OTHER PUBLICATIONS

Japanese Office Action dated May 15, 2012, issued in corresponding Japanese Patent Application No. 2011-137003.

(Continued)

*Primary Examiner* — Keith Hendricks
*Assistant Examiner* — Jason M Berman
(74) *Attorney, Agent, or Firm* — Westerman, Hattori, Daniels & Adrian, LLP

(57) ABSTRACT

A method for producing a transparent conductive film including a transparent film substrate and a crystalline transparent conductive layer, including: a first depositing a first indium-based complex oxide having a first tetravalent metal element oxide on the transparent film substrate; and a second depositing indium oxide or a second indium-based complex oxide and lower than the tetravalent metal element oxide content of the indium-based complex oxide used in the first depositing by sputtering to form an amorphous transparent conductive layer, and crystallizing the amorphous transparent conductive layer. The method allows a reduction in crystallization time.

24 Claims, 2 Drawing Sheets

(56) References Cited

FOREIGN PATENT DOCUMENTS

| | | |
|---|---|---|
| JP | 2008-066055 A | 3/2008 |
| JP | 2010-061942 A | 3/2010 |
| JP | 2011-3446 A | 1/2011 |
| JP | 2011-103289 A | 5/2011 |
| KR | 10-0911640 B1 | 8/2009 |
| TW | 2010-23357 A1 | 6/2010 |
| TW | 2010-26630 A1 | 7/2010 |
| WO | 02/090107 A1 | 11/2002 |

OTHER PUBLICATIONS

Japanese Office Action dated Jun. 7, 2012, issued in corresponding Japanese Patent Application No. 2011-137002.

European Search Report dated Feb. 27, 2012, issued in corresponding European Patent Application No. 11187829.4.

European Search Report dated Feb. 27, 2012, issued in corresponding European Patent Application No. 11187830.2.

Chinese Office Action dated Feb. 1, 2013, issued in corresponding Chinese Patent Application No. 201110346352.9 (5 page).

Taiwanese Office Action dated Dec. 6, 2012, issued in corresponding Taiwanese patent application No. 100139824 (co-pending U.S. Appl. No. 13/280,806), w/ English translation.

Korean Decision for Grant of Patent dated Nov. 28, 2012, issued in corresponding Korean patent application No. 10-2011-0113769 (co-pending U.S. Appl. No. 13/280,806), w/ English translation.

Taiwanese Notice of Allowance dated Dec. 19, 2012, issued in corresponding Taiwanese patent application 100139823.

Chinese Office Action dated Mar. 5, 2013, issued in corresponding Chinese Patent Application No. 201110346353.3, with English translation (10 pages).

* cited by examiner

METHOD FOR PRODUCING TRANSPARENT CONDUCTIVE FILM

BACKGROUND OF THE INVENTION

1. Field of the Invention

The invention relates to a method for producing a transparent conductive film having transparency in the visible light region and including a film substrate and a transparent conductive layer that is provided on the film substrate. The transparent conductive film obtained by the method of the invention is used for transparent electrodes in touch panels or displays such as liquid crystal displays and electroluminescence displays and also used for electromagnetic wave shielding or prevention of static buildup on transparent products. According to position detection method, touch panels may be classified into optical, ultrasonic, capacitance, and resistive touch panels. The transparent conductive film obtained by the method of the invention is suitable for use in capacitance touch panels, specifically, projection-type capacitance touch panels.

2. Description of the Related Art

Concerning a conventional transparent conductive film, the so-called conductive glass is well known, which includes a glass substrate and a transparent conductive layer of indium oxide formed thereon. Unfortunately, it has low flexibility or workability and cannot be used in some applications because the substrate is made of glass.

In recent years, therefore, various plastic films including polyethylene terephthalate films have been used to form substrates because of their advantages such as good impact resistance and light weight as well as flexibility and workability, and there has been used a transparent conductive film including a transparent conductive layer of indium oxide formed on such substrates.

Such a transparent conductive layer is often crystallized to meet requirements such as low resistance, high transmittance, and high durability. The crystallization method generally includes forming an amorphous transparent conductive layer on a film substrate and then crystallizing the amorphous transparent conductive layer by heating or any other method. Unfortunately, when such a transparent conductive film is produced, it is generally difficult to heat the film substrate to 200° C. or higher during the crystallization, depending on the heat resistance of the film substrate. Thus, there is a problem in which the time required to crystallize the transparent conductive layer is longer in the case where the transparent conductive film is produced with a film substrate than in the case where the transparent conductive layer is formed on a glass substrate and crystallized by heating at high temperature.

To solve the crystallization time problem and to satisfy reliability at high temperature and high humidity, it is proposed that transparent conductive layer having a two-layer deposited structure should be formed on a film substrate. For example, it is proposed that after an indium-tin complex oxide with a low tin oxide content should be deposited on the film substrate side and an indium-tin complex oxide with a high tin oxide content should be deposited thereon (JP-A 2006-244771).

SUMMARY OF THE INVENTION

According to JP-A 2006-244771, the crystallization time is reduced to some extent as compared with the case where a single transparent conductive layer is formed. However, there has been a demand for a further reduction in the time for the crystallization of transparent conductive layer.

As mentioned above, transparent conductive films are used as transparent electrodes for touch panels or displays. Projection-type capacitance touch panels have rapidly spread because they enable multi-touch input or gesture input and can be installed in smartphones. Such projection-type capacitance touch panels have a structure in which a pair of transparent conductive films each having a patterned transparent conductive layer are opposed to each other, and in which the capacitance between the upper and lower transparent conductive layers (or voltage amplitude, frequency, or the like) is measured while a current is allowed to flow through the transparent conductive films. When an object such as a finger is put closer to the upper-side transparent conductive film of a projection-type capacitance touch panel, the capacitance between the upper and lower transparent conductive layers changes, so that the part to which the object is put closer is detected. It has been desired that a projection-type capacitance touch panel should be produced using transparent conductive layer with a low resistance (for example, a surface resistance of about 150 $\Omega$/square) so that the sensitivity and resolution of the sensor can be improved. Specifically, it has been desired that the specific resistance should be lowered. Unfortunately, a transparent conductive film produced with a film substrate has a problem in which the upper limit of the heating temperature for the crystallization of the transparent conductive layer is lower than that in the case where a glass substrate is used, and therefore, the specific resistance of the crystallized transparent conductive layer is higher in the transparent conductive film than in the product having the glass substrate. JP-A 2006-244771 discloses that reliability at high temperature and high humidity can be improved in addition to a reduction in crystallization time, but the specific resistance of transparent conductive layer cannot be reduced according to JP-A 2006-244771.

An object of the invention is to provide a method of producing a transparent conductive film that allows a reduction in crystallization time and has crystalline transparent conductive layer.

Another object of the invention is to provide a method of producing a transparent conductive film that allows a reduction in crystallization time and a reduction in specific resistance and has crystalline transparent conductive layer.

To solve the conventional problems, the inventors have accomplished the invention based on the finding that the objects can be achieved by the method of producing the transparent conductive film and other features described below.

The invention relates to a method for producing a transparent conductive film including a transparent film substrate and a crystalline transparent conductive layer provided on at least one surface of the transparent film substrate, including:

first depositing a first indium-based complex oxide having a first tetravalent metal element oxide in which a first content of the first tetravalent metal element oxide is 3 to 35% by weight on the transparent film substrate by sputtering; and second depositing an indium oxide or a second indium-based complex oxide having a second tetravalent metal element oxide in which a second content of the second tetravalent metal element oxide is more than 0% by weight and not more than 6% by weight and lower than the first content by sputtering to form an amorphous transparent conductive layer, and crystallizing the amorphous transparent conductive layer by heating to form the crystalline transparent conductive layer, wherein each of the first and the second contents of the tetravalent metal element oxide content is expressed by the formula: {the amount of the tetravalent metal element oxide/ (the amount of the tetravalent metal element oxide+the amount of indium oxide)}×100(%).

In the method for producing the transparent conductive film, the heating is preferably performed for less than 60 minutes.

In the method for producing the transparent conductive film, a difference between the second content and the first content is preferably 3% by weight or more.

In the method for producing the transparent conductive film, a second thickness of the deposited layer formed in the second depositing is smaller than a first thickness of the deposited layer formed in the first depositing. A difference between the second thickness and the first thickness is preferably 1 nm or more.

In the method for producing the transparent conductive film, the second thickness is preferably 1 to 17 nm, and the first thickness is preferably 9 to 34 nm.

In the method for producing the transparent conductive film, a total thickness of the amorphous transparent conductive layer is preferably 35 nm or less.

In the method for producing the transparent conductive film, a ratio of the second thickness to the total thickness is preferably from 1 to 45%.

In the method for producing the transparent conductive film, an indium-tin complex oxide may be used as the indium-based complex oxide, and tin oxide may be used as the tetravalent metal element oxide.

In the method for producing the transparent conductive film, the transparent conductive layer may be formed on the film substrate with an undercoat layer interposed therebetween.

Conventional transparent conductive layers having a two-layer deposited structure as disclosed in JP-A 2006-244771 include: an indium-tin complex oxide having a low tin oxide content is deposited on the film substrate side; and an indium-tin complex oxide having a high tin oxide content is deposited next to the above deposition. Crystallization time can be reduced to some extent using the transparent conductive layers with such a two-layer deposited structure, as compared with using a single transparent conductive layer. Contrary to the conventional structure, the transparent conductive layer according to the invention includes sequentially performing steps of depositing: a step of depositing an indium-based complex oxide having a high content of the tetravalent metal element oxide, which is provided from the film substrate side; a step of depositing indium oxide or an indium-based complex oxide (such as an indium-tin complex oxide) having a low content of a tetravalent metal element oxide (such as tin oxide). Such a structure makes crystallization time shorter than that for the conventional two-layer deposited structure.

An indium-based complex oxide is generally used for transparent conductive layer. This is because of taking advantage of the fact that doping indium oxide with a tetravalent metal element oxide causes substitution between the trivalent indium and the tetravalent metal element in the process of forming indium oxide crystals by heating or the like, so that excess electrons serve as carriers in the resulting crystalline film. Therefore, as the content of the tetravalent metal element oxide in the indium-based complex oxide increases, current carriers increase, so that the specific resistance decreases.

On the other hand, as the content of the tetravalent metal element oxide increases, impurities capable of inhibiting the crystallization of indium oxide increase. At the same heating temperature, therefore, as the content of the tetravalent metal element oxide increases, the time required for the crystallization increases. It is also considered that if crystal nuclei can be formed with lower energy, the time required for the crystallization of indium oxide can be reduced. Therefore, it is considered that generating necessary energy for the formation of crystal nuclei is rate-limiting in the crystallization.

It is also considered that gas can be generated from the film substrate to affect the indium oxide deposited on the film substrate, and therefore, the deposition formed at a position more apart from the film substrate (toward the uppermost surface side) can be less defective and more susceptible to crystallization.

From the foregoing, it is considered that when the process of forming a transparent conductive layer at the film substrate side includes depositing an indium-based complex oxide having a high tetravalent metal element oxide content and then depositing thereon an indium oxide or an indium-based complex oxide having a low tetravalent metal element oxide content, the deposition located on the front surface side has a low content of impurities including the tetravalent metal element and therefore is susceptible to crystallization, so that the use of such a structure can reduce the time required to crystallize the amorphous transparent conductive layers.

It is considered that the effect of the invention to reduce crystallization time is produced by the feature that in the transparent conductive film including an indium-based complex oxide transparent conductive layer, a transparent conductive layer susceptible to crystallization is placed at a position susceptible to crystallization so that crystal growth in an amorphous transparent conductive layer less susceptible to crystallization can be facilitated.

As mentioned above, as the content of a tetravalent metal element oxide in an indium oxide material for a transparent conductive layer increases, current carriers increase, so that specific resistance decreases. Therefore, it has been considered that a reduction in specific resistance and a reduction in the content of a tetravalent metal element content for the purpose of reducing crystallization time are a trade-off or difficult to achieve at the same time. According to the invention, however, a reduction in crystallization time and a reduction in specific resistance can be achieved at the same time. In the method for producing the transparent conductive film of the invention, indium oxide or an indium-based complex oxide having a low tetravalent metal element oxide content is deposited at the front surface side of the transparent conductive layer. It is therefore considered that since the front surface side transparent conductive layer contains no tetravalent metal element oxide or has a low tetravalent metal element oxide content, the rate of substitution of the tetravalent metal element is rather increased by the acceleration of crystallization, so that the specific resistance can be reduced.

DETAILED DESCRIPTION OF THE PREFERRED EMBODIMENTS

Embodiments of the invention are described below with reference to the drawings. It should be noted that some parts unnecessary for explanation are omitted, and some parts are illustrated in an enlarged, reduced or modified form for easy understanding.

Figure 1:
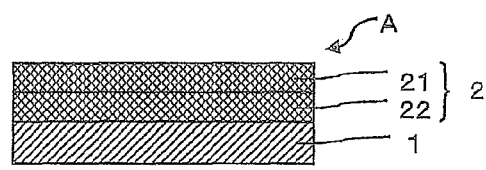
FIG. 1 is a schematic cross-sectional view showing a transparent conductive film according to an embodiment of the invention.
Figure 2A:
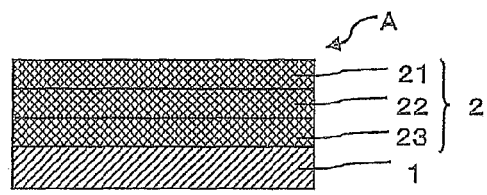
FIG. 2A is a schematic cross-sectional view showing a transparent conductive film according to an embodiment of the invention.
Figure 2B:
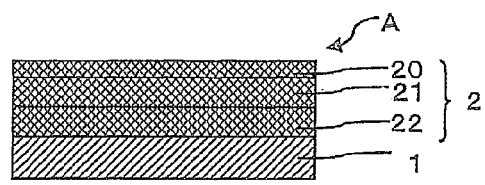
FIG. 2B is a schematic cross-sectional view showing a transparent conductive film according to an embodiment of the invention.
Figure 3:
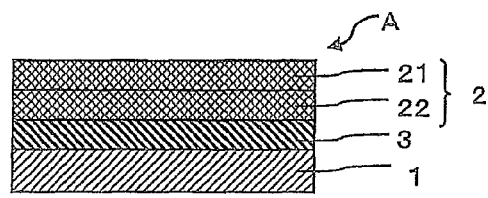
FIG. 3 is a schematic cross-sectional view showing a transparent conductive film according to an embodiment of the invention.

FIGS. 1 to 3 are each a schematic cross-sectional view showing an example of the transparent conductive film (A) according to an embodiment of the invention. Every one of the transparent conductive films (A) includes a transparent film substrate (1) and a transparent conductive layer (2) that includes at least two deposited transparent conductive layers and is formed on one surface of the transparent film substrate (1). All of the deposited layers include indium oxide or an indium-based complex oxide having a tetravalent metal element oxide. The transparent conductive layer (2), which includes at least two deposited layers, may include three or more deposited layers. Each drawing clearly shows the deposited layers of the transparent conductive layer (2), which corresponds to the layers deposited in the deposition step including the steps (A1) and (A2). While FIGS. 1 to 3 each show that the transparent conductive layer (2) is provided on only one surface of the transparent film substrate (1), a deposited layer may also be provided on the other surface of the film substrate (1). A single or two or more deposited layers may also be provided on the other surface, and such two or more deposited layers may form the same structure as those of the transparent conductive layer (2).

FIG. 1 shows a case where a transparent conductive film (A) includes a transparent conductive layer (2), which includes two deposited layers formed in the steps (A1) and (A2) of the deposition step. In the step (A1), an indium-based complex oxide having a tetravalent metal element oxide content of 3 to 35% by weight is deposited by sputtering, wherein the tetravalent metal element oxide content is expressed by the formula: {the amount of the tetravalent metal element oxide/(the amount of the tetravalent metal element oxide+the amount of indium oxide)}×100(%). Subsequently, in the step (A2), indium oxide or an indium-based complex oxide in which the content of the tetravalent metal element oxide is more than 0% by weight and not more than 6% by weight and lower than the tetravalent metal element oxide content of the indium-based complex oxide used in the step (A1) is deposited by sputtering on the deposited layer formed in the step (A1). The deposited layer (22) is formed in the step (A1), and the deposited layer (21) is formed in the step (A2).

FIG. 2A shows a case where a transparent conductive film (A) includes a film substrate (1) and a transparent conductive layer (2) which is formed on the film substrate (1) and includes three deposited layers formed in the steps (A1) and (A2) and another deposition step (A3) which is performed before the steps (A1) and (A2). Therefore, when the transparent conductive film (A) shown in FIG. 2A is formed, a deposited layer (23) is formed in the another deposition step (A3), which is followed by the formation of a deposited layer (22) in the step (A1) and then the formation of a deposited layer (21) in the step (A2).

FIG. 3 shows a case where the transparent conductive layer (2) as shown in FIG. 1 is provided on the film substrate (1) with an undercoat layer (3) interposed therebetween. In the mode shown in FIG. 2, an undercoat layer (3) may also be provided as shown in FIG. 3.

Figure 4:
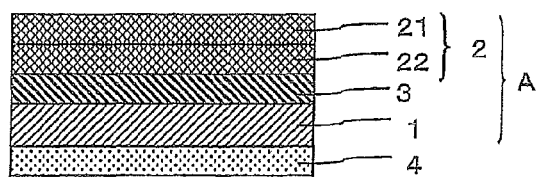
FIG. 4 is a schematic cross-sectional view showing a transparent conductive film according to an embodiment of the invention.

FIG. 4 shows a case where the transparent conductive film (A) as shown in FIG. 1 is configured to have the transparent conductive layer (2) placed on one surface of the film substrate (1) and to have a transparent pressure-sensitive adhesive layer (4) placed on the other surface. While FIG. 4 shows a case where the transparent conductive film (A) shown in FIG. 1 is used to form a transparent conductive layer, the transparent conductive film (A) shown in FIG. 2 or 3 or a combination thereof may also be used alternatively.

Figure 5:
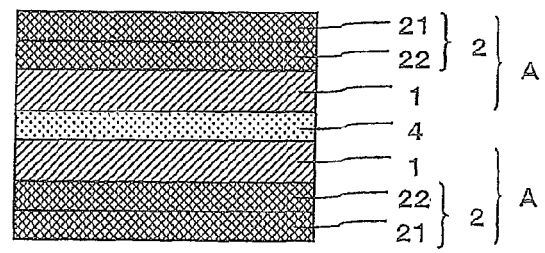
FIG. 5 is a schematic cross-sectional view showing an exemplary sensor part of a projection-type capacitance touch panel produced using a transparent conductive film according to an embodiment of the invention.
Figure 6:
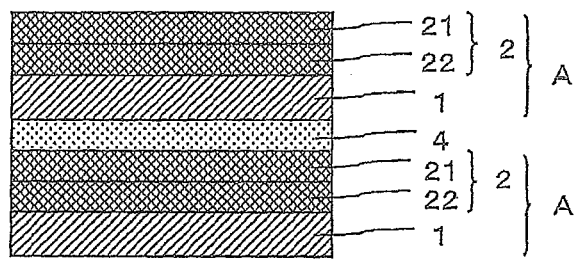
FIG. 6 is a schematic cross-sectional view showing an exemplary sensor part of a projection-type capacitance touch panel produced using a transparent conductive film according to an embodiment of the invention.

FIGS. 5 and 6 are schematic cross-sectional views each showing an exemplary sensor part of a projection-type capacitance touch panel formed using the transparent conductive film (A). While FIGS. 5 and 6 each illustrate a case where the transparent conductive film (A) shown in FIG. 1 is used, the transparent conductive film (A) of FIG. 2 or 3 or a combination thereof may also be used alternatively. FIGS. 5 and 6 each shows a structure in which the transparent conductive films (A) shown in FIG. 1 are opposed to each other with a pressure-sensitive adhesive layer (4) interposed therebetween. In FIG. 5, the film substrates (1) of the transparent conductive films (A) are bonded together with the pressure-sensitive adhesive layer (4) interposed therebetween. In FIG. 6, the film substrate (1) of one of the transparent conductive films (A) is bonded to the other transparent conductive film (A) with the transparent conductive layer (2) interposed therebetween. In FIGS. 5 and 6, the transparent conductive layer (2) (the deposited layers (21) and (22)) has undergone a patterning process. In FIGS. 5 and 6, the transparent conductive film (A) may be placed to face any one of the upper and lower directions. The sensor part of the touch panel shown in FIG. 6 or 7 functions as a transparent switch substrate in which when an object such as a finger is brought close to the transparent conductive layer (2), the on state is produced as a result of the measurement of an electric signal change caused by changes in the capacitance values on the upper and lower sides, and when the object such as the finger is taken away, the original off state is recovered.

Figure 7:
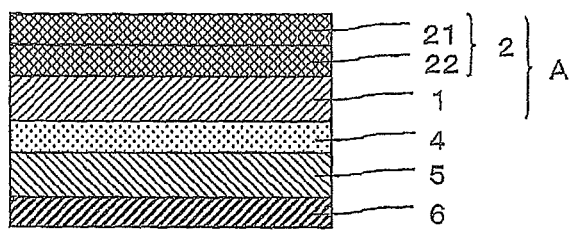
FIG. 7 is a schematic cross-sectional view showing a laminate produced using a transparent conductive film according to an embodiment of the invention.

FIG. 7 shows a case where a single layer of a transparent substrate film (5) is placed on the pressure-sensitive adhesive layer (4), which is provided on the transparent conductive film (A) as shown in FIG. 4. Alternatively, two or more layers of transparent substrate films (5) may be placed through the pressure-sensitive adhesive layer (4). In the case shown in FIG. 7, a hard coat layer (resin layer) (6) is also provided on the outer surface of the substrate film (5). While FIG. 7 shows a case where the transparent conductive film (A) shown in FIG. 1 is used to form a transparent conductive layer, the transparent conductive film (A) of FIG. 2 or 3 or a combination thereof may be used alternatively. The laminate having the transparent conductive film (A) of FIG. 7, which is generally used to form a resistive touch panel, may also be used to form a sensor part of a projection-type capacitance touch panel as shown in FIG. 5 or 6.

Figure 8:
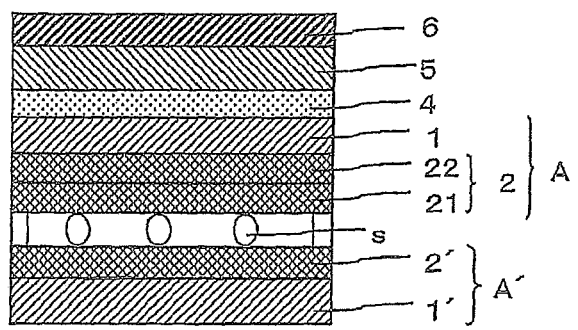
FIG. 8 is a schematic cross-sectional view showing an exemplary resistive touch panel produced using a transparent conductive film according to an embodiment of the invention.

FIG. 8 is a schematic cross-sectional view schematically showing a resistive tough panel. As shown in the drawing, the tough panel has a structure including the transparent conductive film (A) and a lower side substrate (A') that are opposed to each other with spacers (s) interposed therebetween.

The lower side substrate (A') includes another transparent substrate (1') and a transparent conductive layer (2') placed thereon. It will be understood that the invention is not limited to this mode and, for example, the transparent conductive film (A) may also be used to form the lower side substrate (A'). The material used to form another transparent substrate (1') may be basically a glass plate or the same material as used to form the substrate film (5). The thickness and other features of the substrate (1') may also be the same as those of the substrate film (5). The material used to form another transparent conductive layer (2') may be basically any of various transparent conductive materials, and another transparent conductive layer (2') may form the same structure as the transparent conductive layer (2).

The spacers (s) may be of any insulating type, and various known conventional spacers may be used. There is no particular limitation to the method for production of the spacers (s), or the size, position, or number of the spacers (s). The spacers (s) to be used may have any known conventional shape such as a substantially spherical shape or a polygonal shape.

The touch panel shown in FIG. 8 functions as a transparent switch substrate in which contact between the transparent conductive layer (2) and the transparent conductive layer (2') upon tapping with an input pen or the like on the transparent conductive film (A) side against the elastic force of the spacers (s) produces the electrically on state, while removal of the press turns it to the original off state.

The film substrate (1) to be used may be any of various transparent plastic films with no particular limitation. Examples of materials for such films include polyester resins, acetate resins, polyether sulfone resins, polycarbonate resins, polyamide resins, polyimide resins, polyolefin resins, (meth) acrylic resins, polyvinyl chloride resins, polyvinylidene chloride resins, polystyrene resins, polyvinyl alcohol resins, polyarylate resins, and polyphenylene sulfide resins. In particular, polyester resins, polycarbonate resins, and polyolefin resins are preferred.

The thickness of the film substrate (1) is preferably in the range of 2 to 200 µm, more preferably in the range of 2 to 120 µm, even more preferably in the range of 2 to 100 µm. If the thickness of the film substrate (1) is less than 2 µm, the film substrate (1) may have insufficient mechanical strength so that it may be difficult to perform a process of continuously forming the transparent conductive layer (2) and other layers such as the undercoat layer (3) and the pressure-sensitive adhesive layer (4) using a roll of the film substrate (1).

The surface of the film substrate (1) may be previously subjected to sputtering, corona discharge treatment, flame treatment, ultraviolet irradiation, electron beam irradiation, chemical treatment, oxidation, or any other etching or undercoating treatment so that the transparent conductive layer (2) or the undercoat layer (3) to be provided thereon can have improved adhesion to the film substrate (1). If necessary, the film substrate may also be subjected to dust removing or cleaning by solvent cleaning, ultrasonic cleaning, or the like, before the transparent conductive layer (2) or the undercoat layer (3) is formed thereon.

The surface of the film substrate (1), on which the transparent conductive layer (2) will be formed, preferably has an arithmetic average roughness (Ra) of 1.0 nm or less, more preferably 0.7 nm or less, even more preferably 0.6 nm or less, in particular, preferably 0.5 nm or less. When the surface roughness of the film substrate (1) is reduced, the transparent conductive layer (2) can be crystallized by heating for a relatively short period of time, and after the crystallization, the transparent conductive layer (2) can have low resistance. The lower limit of the arithmetic average surface roughness (Ra) of the transparent substrate is preferably, but not limited to, 0.1 nm or more, more preferably 0.2 nm or more, from the standpoint of imparting, to the substrate, the ability to be wound into a roll. The arithmetic average roughness Ra may be measured using an atomic force microscope (AFM) (NanoScope IV manufactured by Digital Instruments).

In general, films made of organic polymer formed products contain a filler or other materials for productivity or handleability and therefore often have an arithmetic average surface roughness Ra of several nm or more. To set the surface roughness of the film substrate (1) in the above range, the undercoat layer (3) is preferably formed on the surface of the film substrate (1), on which the transparent conductive layer (2) will be formed. When the undercoat layer (3) is formed on the surface of the film substrate (1), the irregularities of the surface of the film substrate (1) are reduced so that the surface roughness can be reduced.

It is relatively difficult to crystallize transparent conductive layers of indium-based complex oxides having a high content of a tetravalent metal element oxide. However, when the film substrate (1) used has a specific surface roughness as described above, even an amorphous deposited layer (22) formed using indium oxide or a material with a high content of a tetravalent metal element oxide can be completely crystallized by a heat treatment for a relatively short period of time.

The undercoat layer (3) shown in FIG. 3 may be formed using an inorganic material, an organic material, or a mixture of inorganic and organic materials. Examples of inorganic materials that are preferably used include SiOx (x=1 to 2), $MgF_2$, and $Al_2O_3$. Examples of organic materials include acrylic resins, urethane resins, melamine resins, alkyd resins, siloxane polymers, and other organic substances. In particular, the organic material is preferably a thermosetting resin including a mixture of a melamine resin, an alkyd resin, and an organosilane condensate.

Using any of the above materials, the undercoat layer (3) may be formed by a dry process such as vacuum deposition, sputtering, or ion plating or a wet process (coating process). The undercoat layer (3) may be a single layer or a laminate of two or more layers. In general, the thickness of the undercoat layer (3) (the thickness of each layer in the case of a laminate of plural layers) is preferably from about 1 to about 300 nm.

In the deposition step (A), an amorphous layer including at least two deposited layers is formed on the film substrate (1) by a sputtering method using indium oxide or an indium-based complex oxide. Subsequently, in the heat treatment step (B), the amorphous layer is crystallized by a heat treatment so that a crystalline transparent conductive layer (2) is formed. In the deposition step (A), materials for forming the deposited layers are selected as appropriate depending on the sputtering method. In general, sintered materials of indium oxide and a tetravalent metal element oxide are preferably used. Alternatively, a method of forming deposited layers by a reactive sputtering method may also be used, in which the deposited layers are formed using indium metal and tin metal, while both metals are oxidized.

Examples of the tetravalent metal element include tin, cerium, hafnium, zirconium, and titanium. Oxides of these tetravalent metal elements include tin oxide, cerium oxide, hafnium oxide, zirconium oxide, and titanium oxide. Tin is preferably used as the tetravalent metal element. The tetravalent metal element oxide is preferably tin oxide, and the indium-based complex oxide is preferably an indium-tin complex oxide.

Sputtering methods that may be used in the deposition step (A) include not only standard magnetron sputtering methods using a DC power source but also various sputtering methods such as RF sputtering, RF and DC sputtering, pulsed sputtering, and dual magnetron sputtering methods.

The deposition step (A) includes the steps (A1) and (A2) in which the deposited layers are formed. In the steps (A1) and (A2), the ratio between indium oxide and the tetravalent metal element oxide (or the ratio between indium metal and tetravalent metal), which are materials for forming the deposited layers, is selected. In the step (A1), an indium-based complex oxide having a tetravalent metal element oxide content of 3 to 35% by weight is deposited on the film substrate (1) by sputtering to form the deposited layer (22), wherein the tetravalent metal element oxide content is expressed by the formula: {the amount of the tetravalent metal element oxide/ (the amount of the tetravalent metal element oxide+the amount of indium oxide)}×100(%). Subsequently, in the step (A2), indium oxide or an indium-based complex oxide in which the content of the tetravalent metal element oxide is more than 0% by weight and not more than 6% by weight and lower than the tetravalent metal element oxide content of the indium-based complex oxide used in the step (A1) is deposited by sputtering so that the deposited layer (21) is formed on the deposited layer (22). According to this process, a deposited layer of indium oxide or an indium-based complex oxide having a lower tetravalent metal element oxide content is formed on the front surface side of the amorphous layer formed in the step (A).

The content of the tetravalent metal element oxide in the indium-based complex oxide for use in the step (A1) is from 3 to 35% by weight, preferably from 3 to 25% by weight, more preferably from 5 to 25% by weight, even more preferably from 7 to 25% by weight, still more preferably from 8 to 25% by weight.

In the step (A2), indium oxide or an indium-based complex oxide in which the content of the tetravalent metal element oxide is more than 0% by weight and not more than 6% by weight is used. The content of the tetravalent metal element oxide in the indium-based complex oxide is preferably more than 0% by weight and not more than 5% by weight. The content of the tetravalent metal element oxide in the indium-based complex oxide for use in the step (A2) is controlled to be lower than that in the indium-based complex oxide used in the step (A1). The content of the tetravalent metal element oxide in the deposited layer (21) formed on the front surface side in the step (A2) is preferably as specified above so that crystallization can be accelerated by a heat treatment at a low temperature for a short period of time. If the content of the tetravalent metal element oxide in the deposited layer (21) is more than 6% by weight, the heat treatment step (B) for crystallization will be time-consuming.

The difference between the content of the tetravalent metal element oxide in the indium oxide or the indium-based complex oxide used in the step (A2) and the content of the tetravalent metal element oxide in the indium-based complex oxide used in the step (A1) is preferably 3% by weight or more from the viewpoint of reducing the specific resistance and the crystallization time. The content difference is more preferably from 3 to 35% by weight, even more preferably from 3 to 25% by weight, still more preferably from 5 to 25% by weight.

From the standpoint of keeping the flexibility of the transparent conductive film high, the thickness of the deposited layer (21) formed in the step (A2) may be from 1 to 17 nm, preferably from 1 to 12 nm, more preferably from 1 to 6 nm. The thickness of the deposited layer (22) formed in the step (A1) is generally from 9 to 34 nm, preferably from 9 to 29 nm, more preferably from 9 to 24 nm.

While the deposited layers (21) and (22) may each have a thickness in the above range, for a reduction in specific resistance, the deposited layers (21) and (22) are preferably formed so that the deposited layer (21) has a thickness smaller than that of the deposited layer (22). From the standpoint of reducing specific resistance, such a difference between the thicknesses of the deposited layers (21) and (22) is preferably 1 nm or more, more preferably from 1 to 33 nm, even more preferably from 1 to 20 nm.

The deposition step (A) of forming an amorphous layer includes the steps (A1) and (A2). As shown in FIG. 2A, the step of forming a deposited layer (23) may be performed before the step (A1) of forming the deposited layer (22). The deposited layer (23) is formed by sputtering deposition of indium oxide or an indium-based complex oxide. The content of the tetravalent metal element oxide in the indium-based complex oxide of the deposited layer (23) is not restricted and may be selected from the range of more than 0% by weight and not more than 35% by weight. From the standpoint of reducing the crystallization time, the content of the tetravalent metal element oxide is preferably more than 0% by weight and not more than 6% by weight, more preferably more than 0% by weight and not more than 5% by weight as in the case of the deposited layer (21). The thickness of the deposited layer (23) is generally from 1 to 17 nm, preferably from 1 to 12 nm, more preferably from 1 to 6 nm. While FIG. 2A shows that a single deposited layer (23) is formed on the film substrate (1) side, two or more layers may be formed independently of the deposited layers (21) and (22).

While the deposited layer (21) is preferably formed on the surface of an amorphous layer in the deposition step (A) of forming an amorphous layer, another layer that does not affect the invention may also be formed on the front surface of the deposited layer (21). For example, it is acceptable to form a very thin deposited layer (20) on the uppermost surface of the amorphous layer as long as the supply of oxygen to the deposited layer (21) is not interfered with.

As shown in FIG. 2B, the step (A2) of forming the deposited layer (21) may be followed by the step of forming the deposited layer (20). The thickness of the deposited layer (20) provided on the uppermost surface of the amorphous layer formed in the step (A) is preferably 5 nm or less. In this case, the deposited layer (20) can be formed so as not to interfere with the supply of oxygen to the deposited layer (21), and its thickness is preferably 3 nm or less, more preferably 1 nm or less. The deposited layer (20) may be formed using indium oxide or an indium-based complex oxide having a tetravalent metal element oxide content of more than 0% by weight and not more than 35% by weight, which is non-limiting.

The amorphous layer formed in the deposition step (A), which includes the deposited layers (21) and (22) as described above, preferably has a total thickness of 35 nm or less, more preferably 30 nm or less, so that it can have a high transmittance.

In order to reduce the specific resistance, the amorphous layer is preferably designed so that the ratio of the thickness of the deposited layer (21) to the total thickness of the amorphous layer is from 1 to 45%. The ratio of the thickness of the deposited layer (21) is preferably from 1 to 30%, more preferably from 1 to 20%.

The sputtering target for use in the sputtering deposition is selected from indium oxide or an indium-based complex oxide, depending on each deposited layer for the amorphous layer. In addition, the content of the tetravalent metal element oxide in the indium-based complex oxide is controlled. The sputtering deposition using such a target is performed in a sputtering system, which is evacuated to high vacuum and into which argon gas, an inert gas, is introduced. When the sputtering target used is a metal target made of indium or indium-tetravalent metal (for example, indium-tin), reactive sputtering deposition should be performed with argon gas introduced together with an oxidizing agent such as oxygen gas. Even when an oxide target such as indium oxide or an indium-based complex oxide is used, argon gas may also be introduced together with oxygen gas or the like.

Water molecules present in the deposition atmosphere may terminate dangling bonds, which are produced during the deposition, so that the crystal growth of indium oxide or an indium-based complex oxide may be hindered. Therefore, the partial pressure of water in the deposition atmosphere is preferably low. During the deposition, the water partial pressure is preferably 0.1% or less, more preferably 0.07% or less, based on the partial pressure of argon gas. During the deposition, the water partial pressure is also preferably $2\times10^{-4}$ Pa or less, more preferably $1.5\times10^{-4}$ Pa or less, even more preferably $1\times10^{-4}$ Pa or less. In order for the water partial pressure during the deposition to be in the above range, the sputtering system before the start of the deposition is preferably evacuated until the water partial pressure reaches $2\times10^{-4}$ Pa or less, preferably $1.5\times10^{-4}$ Pa or less, more preferably $1\times10^{-4}$ Pa or less so as to fall within the above range so that impurities such as water and organic gas produced from the substrate can be removed from the atmosphere in the system.

During the sputtering deposition, the substrate temperature is preferably higher than 100° C. When the substrate temperature is set higher than 100° C., the crystallization of the indium-based complex oxide film (even with a high tetravalent metal atom content) can be easily accelerated in the heat treatment process described below, and a low-resistance, crystalline, transparent conductive layer (2) can be obtained. Therefore, in order to form a low-resistance, crystalline, transparent conductive layer (2) in the process of crystallizing an amorphous transparent conductive layer (2) by heating, the substrate temperature is preferably 120° C. or more, more preferably 130° C. or more, in particular, preferably 140° C. or more. In order to suppress thermal damage to the substrate, the substrate temperature is preferably 200° C. or less, more preferably 180° C. or less, even more preferably 170° C. or less, in particular, preferably 160° C. or less.

As used herein, the term "substrate temperature" refers to the set temperature of a base on which the substrate is placed during the sputtering deposition. For example, when the sputtering deposition is continuously performed in a roll-to-roll sputtering system, the substrate temperature corresponds to the temperature of a can roll on which the sputtering deposition is performed. When the sputtering deposition is performed by a piece-by-piece method (batch method), the substrate temperature corresponds to the temperature of a substrate holder for holding the substrate.

In the method of the invention for producing a transparent conductive film, the amorphous transparent conductive layer (2) formed in the deposition step (A) can be crystallized by heating for 45 minutes or less in the heat treatment step (B), so that a crystalline transparent conductive layer (2) of an indium-based complex oxide is formed. The heat treatment step (B) may be performed using heating means such as an infrared heater or a hot-air circulation oven according to known methods. In such a process, the heat treatment temperature should be 150° C. or less, which is acceptable to the film substrate. In an embodiment of the invention, a heat treatment at such a low temperature for a short period of time can achieve sufficient crystallization. Specifically, a heat treatment at 150° C. for a time period of 45 minutes or less enables the formation of a high-quality crystalline layer.

In the heat treatment step (B), the heating temperature is preferably from 120° C. to 150° C., more preferably from 125° C. to 150° C., even more preferably from 130° C. to 150° C. The sufficient heating time is preferably less than 60 minutes and further can be reduced to 45 minutes or less, so that the crystallization time can be reduced. When the heating temperature and the heating time are appropriately selected, the layer can be completely crystallized with no reduction in productivity or Quality. In order to crystallize the amorphous transparent conductive layer (2) completely, the heating is preferably performed for a time period of 30 minutes or more.

When the transparent conductive film is used to form a projection-type capacitance touch panel, a matrix-type resistive touch panel, or any other touch panel, the transparent conductive layer (2) is patterned into a specific shape (for example, a strip shape) in some cases. However, when crystallized by the heat treatment, the indium oxide deposition or the indium-based complex oxide deposition is less susceptible to an etching process with an acid. In contrast, the amorphous indium oxide or indium-based complex oxide film before the heat treatment can be easily processed by etching. Therefore, when the transparent conductive layer (2) is patterned by etching, the amorphous transparent conductive layer (2) should preferably be subjected to the etching process after the deposition step (A) before the heat treatment step (B).

A transparent pressure-sensitive adhesive layer (4) may be provided on the other surface of the film substrate (1). The transparent pressure-sensitive adhesive layer (4) may be of any type having transparency. Specific examples include transparent pressure-sensitive adhesive layers including, as a base polymer, an acryl-based polymer, a silicone polymer, polyester, polyurethane, polyamide, polyvinyl ether, a vinyl acetate-vinyl chloride copolymer, modified polyolefin, an epoxy polymer, a fluoropolymer, rubber such as natural rubber or synthetic rubber, or any other polymer, which may be appropriately selected and used. In particular, an acryl-based pressure-sensitive adhesive is preferably used because it has high optical transparency and an appropriate level of adhesive properties such as wettability, cohesiveness, and tackiness.

The pressure-sensitive adhesive layer (4) has a cushion effect and thus can function to improve the scratch resistance of the transparent conductive layer (2) formed on one side of the film substrate (1) and to improve tap properties, so-called pen input durability and contact pressure durability, for touch panels. In order to perform this function better, it is preferred that the elastic modulus of the pressure-sensitive adhesive layer (4) should be set in the range of 1 to 100 N/cm$^2$ and that its thickness should be set to 1 μm or more, generally in the range of 5 to 100 μm.

If the thickness of the pressure-sensitive adhesive layer (4) is less than 1 μm, the cushion effect can no longer be expected, so that it will tend to be difficult to improve the scratch resistance of the transparent conductive layer (2) or pen input durability and contact pressure durability for touch panels. On the other hand, if it is too thick, it may have reduced transparency, or good results may be difficult to obtain with respect to the formation of the pressure-sensitive adhesive layer (4), the bonding workability, and the cost.

EXAMPLES

Hereinafter, the invention is described in more detail with reference to the examples, which however are not intended to limit the gist of the invention. In each example, all parts are by weight unless otherwise specified.

(Arithmetic Average Roughness)

The arithmetic average roughness was measured using an atomic force microscope (AFM) (NanoScope IV manufactured by Digital Instruments).

Example 1

A 30 nm thick undercoat layer of a thermosetting resin composed of a melamine resin, an alkyd resin, and an organosilane condensate (2:2:1 in weight ratio) was formed on one surface of a film substrate made of a 23 μm thick polyethylene terephthalate film (hereinafter referred to as PET film). The surface of the undercoat layer had an arithmetic average roughness Ra of 0.5 nm.

A 20 nm thick deposited layer of an indium-tin complex oxide was formed on the undercoat layer by a reactive sputtering method using a sintered material of 90% indium oxide and 10% tin monoxide in a 0.4 Pa atmosphere composed of 80% by volume of argon gas and 20% by volume of oxygen gas. The deposition process included evacuating the sputtering system until the water partial pressure at the time of deposition reached $8.0 \times 10^{-5}$ Pa, then introducing argon gas and oxygen gas, and performing the deposition at a substrate temperature of 140° C. in an atmosphere with a water partial pressure of $8.0 \times 10^{-5}$ Pa. At this time, the water partial pressure was 0.05% of the partial pressure of the argon gas. The resulting deposited layer corresponds to the deposited layer (22) of FIG. 1 formed in the step (A1).

A 5 nm thick deposited layer of an indium-tin complex oxide was formed on the deposited layer (22) by a reactive sputtering method using a sintered material of indium oxide. The deposition process included evacuating the sputtering system until the water partial pressure at the time of deposition reached $8.0 \times 10^{-5}$ Pa, then introducing argon gas and oxygen gas, and performing the deposition at a substrate temperature of 140° C. in an atmosphere with a water partial pressure of $8.0 \times 10^{-5}$ Pa. At this time, the water partial pressure was 0.05% of the partial pressure of the argon gas. The resulting deposited layer corresponds to the deposited layer (21) of FIG. 1 formed in the step (A2).

In this way, a transparent conductive layer including the deposited layers (22) and (21) was formed to obtain a transparent conductive film. Subsequently, the resulting transparent conductive film was heat-treated at 140° C. in a hot-air circulation oven so that the transparent conductive layer was crystallized.

Examples 2 to 7 and 9 to 13

Transparent conductive films were prepared as in Example 1, except that the content of tin oxide in the sintered indium oxide-tin oxide material and the thickness of each layer, which were used in forming the deposited layer (22) in the step (A1) and in forming the deposited layer (21) in the step (A2), were changed as shown in Table 1. Each transparent conductive layer was also crystallized as in Example 1. In Table 1, "tin oxide content" indicates the content of tin oxide in the indium oxide or indium-tin complex oxide material used as the sputtering target. A tin oxide content of "0%" indicates the case using indium oxide. The thickness of the deposited layer indicates the thickness before the crystallization. The content of tin oxide and the thickness of the deposited layer are considered to be unchanged even after the crystallization.

Example 8

An undercoat layer was formed on one surface of a film substrate as in Example 1. A 3 nm thick deposited layer of an indium-tin complex oxide was formed on the undercoat layer by a reactive sputtering method using a sintered material of 97% indium oxide and 3% tin monoxide in a 0.4 Pa atmosphere composed of 80% by volume of argon gas and 20% by volume of oxygen gas. The deposition process included evacuating the sputtering system until the water partial pressure at the time of deposition reached $8.0 \times 10^{-5}$ Pa, then introducing argon gas and oxygen gas, and performing the deposition at a substrate temperature of 140° C. in an atmosphere with a water partial pressure of $8.0 \times 10^{-5}$ Pa. At this time, the water partial pressure was 0.05% of the partial pressure of the argon gas. The resulting deposited layer corresponds to the deposited layer (23) of FIG. 2A formed in another step.

A 19 nm thick deposited layer of an indium-tin complex oxide was further formed on the resulting deposited layer (23) by a reactive sputtering method using a sintered material of 90% indium oxide and 10% tin monoxide. The deposition process included evacuating the sputtering system until the water partial pressure at the time of deposition reached $8.0 \times 10^{-5}$ Pa, then introducing argon gas and oxygen gas, and performing the deposition at a substrate temperature of 140° C. in an atmosphere with a water partial pressure of $8.0 \times 10^{-5}$ Pa. At this time, the water partial pressure was 0.05% of the partial pressure of the argon gas. The resulting deposited layer corresponds to the deposited layer (22) of FIG. 2A.

A 3 nm thick deposited layer of an indium-tin complex oxide was further formed on the deposited layer (22) by a reactive sputtering method using a sintered material of 97% indium oxide and 3% tin monoxide. The deposition process included evacuating the sputtering system until the water partial pressure at the time of deposition reached $8.0 \times 10^{-5}$ Pa, then introducing argon gas and oxygen gas, and performing the deposition at a substrate temperature of 140° C. in an atmosphere with a water partial pressure of $8.0 \times 10^{-5}$ Pa. At this time, the water partial pressure was 0.05% of the partial pressure of the argon gas. The resulting deposited layer corresponds to the deposited layer (21) of FIG. 2A.

In this way, a transparent conductive layer including the deposited layer (23), the deposited layer (21) and the deposited layer (21), which are amorphous deposited layers, was formed to obtain a transparent conductive film. Subsequently, the resulting transparent conductive film was heat-treated at 140° C. in a hot-air circulation oven so that the transparent conductive layer was crystallized.

Comparative Example 1

An undercoat layer was formed on one surface of a film substrate as in Example 1. A 25 nm thick amorphous transparent conductive layer of an indium-tin complex oxide was formed on the undercoat layer by a reactive sputtering method using a sintered material of 90% indium oxide and 10% tin monoxide in a 0.4 Pa atmosphere composed of 80% by volume of argon gas and 20% by volume of oxygen gas. Subsequently, the resulting transparent conductive film was heat-treated at 150° C. in a hot-air circulation oven so that the transparent conductive layer was crystallized.

Comparative Examples 2 to 5

Amorphous transparent conductive films were prepared as in Example 1, except that the content of tin oxide in the sintered indium oxide-tin oxide material and the thickness of each layer, which were used in forming the deposited layer (22) in the step (A1) and in forming the deposited layer (21) in the step (A2), were changed as shown in Table 1. Each transparent conductive layer was also crystallized as in Example 1. The crystallization time is shown in Table 1.

(Evaluation)

The transparent conductive films obtained in the examples and the comparative examples were evaluated as described below. The results are shown in Table 1.

<Thickness of Each Layer>

The thickness of the film substrate was measured with a microgauge type thickness gauge manufactured by Mitutoyo Corporation. The thickness of each of the undercoat layer and the deposited layer was calculated using an instantaneous multichannel photodetector system MCPD-2000 (trade name) manufactured by Otsuka Electronics Co., Ltd., based on the waveform data on the resulting interference spectrum.

<Crystallization Time>

In each example, the time (minutes) required to crystallize the amorphous deposited layer was measured. The heating was performed at 140° C. using a hot-air circulation oven, and whether the amorphous deposited layer was crystallized was determined by "checking the completion of the change (reduction) in resistance value" and performing an "etching test" as described below.

"Checking the completion of the change (reduction) in resistance value": While the heating was performed at 140° C. using a hot-air circulation oven, the surface resistance value was measured every 30 minutes. As the crystallization proceeds, the surface resistance value decreases, and when the crystallization is completed, the surface resistance value becomes constant. Therefore, the crystallization time was determined at the time when the surface resistance value became constant.

"Etching test": The transparent conductive layer was immersed in hydrochloric acid with a concentration of 5% by weight for 15 minutes, and then the resistance value ($\Omega$) between two points 15 mm apart was measured using a tester (DIGITAL TESTER (M-04) (product name) manufactured by CUSTOM, measurement limit: 2 M$\Omega$) to determine whether or not the transparent conductive layer (laminate) was crystallized. When a certain resistance value was detected, it was determined that the transparent conductive layer (laminate) was crystallized.

<Surface Resistance>

The surface resistance (U/square) of the transparent conductive layer in each transparent conductive film was measured using a four-terminal method.

<Specific Resistance>

The thickness of the transparent conductive layer was measured using an X-ray fluorescence analyzer (manufactured by Rigaku Corporation), and the specific resistance was calculated from the surface resistance and the thickness.

TABLE 1

| | Transparent conductive layer | | | | | | | Evaluation | | |
|---|---|---|---|---|---|---|---|---|---|---|
| | Step (A2) | | Step (A1) | | Another Step (A3) | | | | | |
| | Tin oxide content (wt %) | Thickness (nm) | Tin oxide content (wt %) | Thickness (nm) | Tin oxide content (wt %) | Thickness (nm) | Total thickness (nm) | Crystallization time (minutes) | Surface resistance ($\Omega$/square) | Specific resistance ($\Omega \cdot$ cm) |
| Example 1 | 0 | 5 | 10 | 20 | — | — | 25 | 30 | 150 | $3.75 \times 10^{-4}$ |
| Example 2 | 0 | 5 | 15 | 20 | — | — | 25 | 30 | 130 | $3.25 \times 10^{-4}$ |
| Example 3 | 0 | 5 | 35 | 20 | — | — | 25 | 45 | 130 | $3.25 \times 10^{-4}$ |
| Example 4 | 3 | 5 | 10 | 20 | — | — | 25 | 30 | 130 | $3.25 \times 10^{-4}$ |
| Example 5 | 3 | 10 | 10 | 15 | — | — | 25 | 30 | 140 | $3.50 \times 10^{-4}$ |
| Example 6 | 3 | 3 | 10 | 22 | — | — | 25 | 30 | 130 | $3.25 \times 10^{-4}$ |
| Example 7 | 3 | 13 | 10 | 12 | — | — | 25 | 30 | 150 | $3.75 \times 10^{-4}$ |
| Example 8 | 3 | 3 | 10 | 19 | 3 | 3 | 25 | 30 | 130 | $3.25 \times 10^{-4}$ |
| Example 9 | 3 | 5 | 15 | 20 | — | — | 25 | 30 | 130 | $3.25 \times 10^{-4}$ |
| Example 10 | 3 | 5 | 35 | 20 | — | — | 25 | 45 | 130 | $3.25 \times 10^{-4}$ |
| Example 11 | 6 | 5 | 10 | 20 | — | — | 25 | 30 | 140 | $3.50 \times 10^{-4}$ |
| Example 12 | 6 | 5 | 15 | 20 | — | — | 25 | 30 | 130 | $3.25 \times 10^{-4}$ |
| Example 13 | 6 | 5 | 35 | 20 | — | — | 25 | 45 | 130 | $3.25 \times 10^{-4}$ |
| Comparative Example 1 | 10 | 25 | — | — | — | — | 25 | 90 | 150 | $3.75 \times 10^{-4}$ |
| Comparative Example 2 | 10 | 20 | 3 | 5 | — | — | 25 | 60 | 150 | $3.75 \times 10^{-4}$ |
| Comparative Example 3 | 8 | 5 | 10 | 20 | — | — | 25 | 90 | 140 | $3.50 \times 10^{-4}$ |
| Comparative Example 4 | 8 | 5 | 15 | 20 | — | — | 25 | 120 | 130 | $3.25 \times 10^{-4}$ |
| Comparative Example 5 | 8 | 5 | 35 | 20 | — | — | 25 | >120 | — | — |

It is apparent that the crystallization time is shorter in the examples than in the comparative examples. It is also apparent that when the thickness of the deposited layer (21) is controlled to be smaller than the thickness of the deposited layer (22) as in the examples, the surface resistance and the specific resistance can be reduced.

What is claimed is:

1. A method for producing a transparent conductive film comprising a transparent plastic film substrate and a crystalline transparent conductive layer provided on at least one surface of the transparent plastic film substrate, comprising:
- first depositing a first indium-based complex oxide having a first tetravalent metal element oxide in which a first content of the first tetravalent metal element oxide is 3 to 35% by weight on the transparent plastic film substrate by sputtering, wherein the deposited layer formed in the first depositing step has a first thickness of 9 to 34 nm,
- second depositing an indium oxide or a second indium-based complex oxide having a second tetravalent metal element oxide in which a second content of the second tetravalent metal element oxide is more than 0% by weight and not more than 6% by weight and lower than the first content by sputtering to form an amorphous transparent layer, wherein the deposited layer formed in the second depositing step has a second thickness of 1 to 17 nm,
- wherein each of the first and the second contents of the tetravalent metal element oxide content is expressed by the formula: {the amount of the tetravalent metal element oxide/(the amount of the tetravalent metal element oxide+the amount of indium oxide)}×100(%),
- crystallizing the amorphous transparent layer by heating to form the crystalline transparent conductive layer,
- wherein the heating is performed for less than 60 minutes.

2. The method according to claim 1, wherein a difference between the second content and the first content is 3% by weight or more.

3. The method according to claim 1, wherein the second thickness of the deposited layer formed in the second depositing is smaller than the first thickness of the deposited layer formed in the first depositing.

4. The method according to claim 3, wherein a difference between the second thickness and the first thickness is 1 nm or more.

5. The method according to claim 1, wherein a total thickness of the amorphous transparent conductive layer is 35 nm or less.

6. The method according to claim 1, wherein a ratio of the second thickness to the total thickness is from 1 to 45%.

7. The method according to claim 1, wherein the indium-based complex oxide is an indium-tin complex oxide, and the tetravalent metal element oxide is tin oxide.

8. The method according to claim 1, wherein the transparent conductive layer is formed on the film substrate with an undercoat layer interposed therebetween.

9. A method for producing a transparent conductive film comprising a transparent plastic film substrate and a crystalline transparent conductive layer provided on at least one surface of the transparent plastic film substrate, comprising:
- first depositing a first indium-based complex oxide having a first tetravalent metal element oxide in which a first content of the first tetravalent metal element oxide is 3 to 35% by weight on the transparent plastic film substrate by sputtering,
- second depositing an indium oxide or a second indium-based complex oxide having a second tetravalent metal element oxide in which a second content of the second tetravalent metal element oxide is more than 0% by weight and not more than 6% by weight and lower than the first content by sputtering to form an amorphous transparent layer,
- wherein each of the first and the second contents of the tetravalent metal element oxide content is expressed by the formula: {the amount of the tetravalent metal element oxide/(the amount of the tetravalent metal element oxide+the amount of indium oxide)}×100(%),
- crystallizing the amorphous transparent layer by heating to form the crystalline transparent conductive layer,
- wherein the heating is performed for less than 60 minutes.

10. The method according to claim 1, wherein a difference between the second content and the first content is 3% by weight or more.

11. The method according to claim 9, wherein the second thickness of the deposited layer formed in the second depositing is smaller than the first thickness of the deposited layer formed in the first depositing.

12. The method according to claim 11, wherein a difference between the second thickness and the first thickness is 1 nm or more.

13. The method according to claim 9, wherein a total thickness of the amorphous transparent conductive layer is 35 nm or less.

14. The method according to claim 9, wherein a ratio of the second thickness to the total thickness is from 1 to 45%.

15. The method according to claim 9, wherein the indium-based complex oxide is an indium-tin complex oxide, and the tetravalent metal element oxide is tin oxide.

16. The method according to claim 9, wherein the transparent conductive layer is formed on the film substrate with an undercoat layer interposed therebetween.

17. A method for producing a transparent conductive film comprising a transparent film substrate and a crystalline transparent conductive layer provided on at least one surface of the transparent film substrate, comprising:
- first depositing a first indium-based complex oxide having a first tetravalent metal element oxide in which a first content of the first tetravalent metal element oxide is 3 to 35% by weight on the transparent film substrate by sputtering, wherein the deposited layer formed in the first depositing step has a first thickness of 9 to 34 nm,
- second depositing an indium oxide or a second indium-based complex oxide having a second tetravalent metal element oxide in which a second content of the second tetravalent metal element oxide is more than 0% by weight and not more than 6% by weight and lower than the first content by sputtering to form an amorphous transparent layer, wherein the deposited layer formed in the second depositing step has a second thickness of 1 to 17 nm,
- wherein each of the first and the second contents of the tetravalent metal element oxide content is expressed by the formula: {the amount of the tetravalent metal element oxide/(the amount of the tetravalent metal element oxide+the amount of indium oxide)}×100(%),
- crystallizing the amorphous transparent layer by heating to form the crystalline transparent conductive layer,
- wherein the heating is performed for less than 60 minutes.

18. The method according to claim 17, wherein a difference between the second content and the first content is 3% by weight or more.

19. The method according to claim 17, wherein the second thickness of the deposited layer formed in the second depositing is smaller than the first thickness of the deposited layer formed in the first depositing.

20. The method according to claim 19, wherein a difference between the second thickness and the first thickness is 1 nm or more.

21. The method according to claim 17, wherein a total thickness of the amorphous transparent conductive layer is 35 nm or less.

22. The method according to claim 17, wherein a ratio of the second thickness to the total thickness is from 1 to 45%.

23. The method according to claim 17, wherein the indium-based complex oxide is an indium-tin complex oxide, and the tetravalent metal element oxide is tin oxide.

24. The method according to claim 17, wherein the transparent conductive layer is formed on the film substrate with an undercoat layer interposed therebetween.

* * * * *